United States Patent
Mochizuki et al.

(10) Patent No.: US 10,529,851 B1
(45) Date of Patent: Jan. 7, 2020

(54) FORMING BOTTOM SOURCE AND DRAIN EXTENSION ON VERTICAL TRANSPORT FET (VTFET)

(71) Applicant: International Business Machines Corporation, Armonk, NY (US)

(72) Inventors: Shogo Mochizuki, Clifton Park, NY (US); Kangguo Cheng, Schenectady, NY (US); Juntao Li, Cohoes, NY (US); Choonghyun Lee, Rensselaer, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/033,994

(22) Filed: Jul. 12, 2018

(51) Int. Cl.
| | | |
|---|---|---|
| *H01L 29/78* | (2006.01) | |
| *H01L 21/225* | (2006.01) | |
| *H01L 21/324* | (2006.01) | |
| *H01L 29/66* | (2006.01) | |
| *H01L 29/49* | (2006.01) | |

(Continued)

(52) U.S. Cl.
CPC ...... *H01L 29/7827* (2013.01); *H01L 21/2254* (2013.01); *H01L 21/324* (2013.01); *H01L 21/76895* (2013.01); *H01L 29/0856* (2013.01); *H01L 29/4966* (2013.01); *H01L 29/6656* (2013.01); *H01L 29/66666* (2013.01); *H01L 21/0245* (2013.01); *H01L 21/02532* (2013.01); *H01L 21/28026* (2013.01); *H01L 29/0873* (2013.01); *H01L 29/161* (2013.01); *H01L 29/167* (2013.01)

(58) Field of Classification Search
CPC ................. H01L 21/823487; H01L 29/66666
See application file for complete search history.

(56) References Cited

U.S. PATENT DOCUMENTS

| 7,485,536 B2 | 2/2009 | Jin et al. |
|---|---|---|
| 7,642,140 B2 | 1/2010 | Bae et al. |

(Continued)

OTHER PUBLICATIONS

Khakifirooz et al., "High-performance partially depleted SOI PFETs with in situ doped SiGe raised source/drain and implant-free extension," IEEE Electron Device Letters, 32(3), pp. 267-269 (Mar. 2011).

(Continued)

*Primary Examiner* — Farun Lu
(74) *Attorney, Agent, or Firm* — Vazken Alexanian; Michael J. Chang, LLC

(57) ABSTRACT

Techniques for forming bottom source and drain extensions in VTFET devices are provided. In one aspect, a method of forming a VTFET device includes: patterning fins in a wafer; forming a liner at a base of the fins having a higher diffusivity for dopants than the fins; forming sidewall spacers alongside an upper portion of the fins; forming bottom source/drains on the liner at the base of the fins including the dopants; annealing the wafer to diffuse the dopants from the bottom source/drains, through the liner, into the base of the fins to form bottom extensions; removing the sidewall spacers; forming bottom spacers on the bottom source/drains; forming gate stacks alongside the fins above the bottom spacers; forming top spacers above the gate stacks; and forming top source/drains above the top spacers at tops of the fins. A VTFET device is also provided.

16 Claims, 7 Drawing Sheets

(51) Int. Cl.
  *H01L 29/08*   (2006.01)
  *H01L 21/768*  (2006.01)
  *H01L 29/167*  (2006.01)
  *H01L 21/02*   (2006.01)
  *H01L 21/28*   (2006.01)
  *H01L 29/161*  (2006.01)

(56) References Cited

U.S. PATENT DOCUMENTS

| | | |
|---|---|---|
| 7,666,748 B2 | 2/2010 | Jain |
| 8,247,285 B2 | 8/2012 | Lin et al. |
| 8,338,885 B2 | 12/2012 | Hoentschel et al. |
| 9,865,596 B2 | 1/2018 | Shifren et al. |
| 9,941,356 B1 | 4/2018 | Lin et al. |
| 2012/0100682 A1* | 4/2012 | Munetaka ......... H01L 29/42356 438/270 |
| 2017/0040449 A1 | 2/2017 | Asenov |

OTHER PUBLICATIONS

Ikuta et al., "Atmospheric in situ Arsenic-Doped SiGe Selective Epitaxial Growth for Raised-Extension N-type Metal-Oxide-Semiconductor Field-Effect Transistor." Japanese journal of applied physics, 46(4S), pp. 1916-1920 (Apr. 2007).

Larson et al., "Ion implantation for semiconductor doping and materials modification," Reviews of Accelerator Science and Technology: vol. 4: Accelerator Applications in Industry and the Environment, pp. 11-40 (Dec. 2011).

Chroneos et al., "Diffusion of n-type dopants in germanium," Applied Physics Reviews 1, 011301 (Jan. 2014) (20 pages).

Eguchi et al., "Comparison of arsenic and phosphorous diffusion behavior in silicon-germanium alloys," Applied Physics Letters, vol. 80, No. 10, pp. 1743-1745 (Mar. 2002).

Chidambaram et al., "Fundamentals of Silicon Material Properties for Successful Exploitation of Strain Engineering in Modern CMOS Manufacturing," IEEE Transactions on Electron Devices, vol. 53, No. 5, pp. 944-964 (May 2006).

* cited by examiner

FORMING BOTTOM SOURCE AND DRAIN EXTENSION ON VERTICAL TRANSPORT FET (VTFET)

FIELD OF THE INVENTION

The present invention relates to vertical transport field effect transistor (VTFET) devices, and more particularly, to techniques for forming bottom source and drain extensions in VTFET devices.

BACKGROUND OF THE INVENTION

As opposed to planar complementary metal-oxide-semiconductor (CMOS) devices, vertical transport field effect transistor (VTFET) devices are oriented with a vertical fin channel disposed on bottom source and drains and top source and drains disposed on the fin channel. VFETs have been pursued as a potential device option for scaling CMOS to the 5 nanometer (nm) node and beyond.

With a VTFET process flow, the bottom source and drains are often formed by recessing the substrate and then forming doped bottom source and drains at the base of the recessed fins. The bottom extensions are then formed using a drive-in of the dopants into the fins. However, getting a controlled abrupt junction profile by this process is challenging.

Specifically, a higher thermal budget (e.g., from about 900° C. to about 1050° C.) is needed for dopant drive-in to form the extensions in this manner. Diffusion with a high thermal budget ends up with a broad dopant profile which is undesirable.

Therefore, improved techniques for forming bottom extensions with an abrupt dopant profile using a lower thermal budget would be desirable.

SUMMARY OF THE INVENTION

The present invention provides techniques for forming bottom source and drain extensions in vertical transport field effect transistor (VTFET) devices. In one aspect of the invention, a method of forming a VTFET device is provided. The method includes: patterning fins in a wafer; forming a liner at a base of the fins, wherein the liner has a higher diffusivity for dopants than the fins; forming sidewall spacers alongside an upper portion of the fins, wherein the sidewall spacers partially overlap the liner; forming bottom source and drains on the liner at the base of the fins below the sidewall spacers, wherein the bottom source and drains include the dopants; annealing the wafer to diffuse the dopants from the bottom source and drains, through the liner, into the base of the fins to form bottom extensions; removing the sidewall spacers; forming bottom spacers on the bottom source and drains; forming gate stacks alongside the fins above the bottom spacers; forming top spacers above the gate stacks; and forming top source and drains above the top spacers at tops of the fins.

In one aspect of the invention, a VTFET device is provided. The VTFET device includes: fins patterned in a wafer; a liner disposed at a base of the fins, wherein the liner has a higher diffusivity for dopants than the fins; bottom source and drains disposed on the liner at the base of the fins; bottom extensions formed in the base of the fins including the dopants; bottom spacers disposed on the bottom source and drains; gate stacks alongside the fins above the bottom spacers; top spacers above the gate stacks; and top source and drains above the top spacers at tops of the fins.

A more complete understanding of the present invention, as well as further features and advantages of the present invention, will be obtained by reference to the following detailed description and drawings.

DETAILED DESCRIPTION OF PREFERRED EMBODIMENTS

Provided herein are techniques for vertical transport field effect transistor (VTFET) device fabrication having a reduced thermal budget for dopant drive-in through the use of a liner in close proximity to the fins which provides for a high diffusivity of dopants. Advantageously, once dopants diffuse through the liner there is less diffusion in the fin which produces an abrupt dopant profile. The resulting extensions have a unique concave profile that curves inward at the vertical fin channel.

Figure 1:
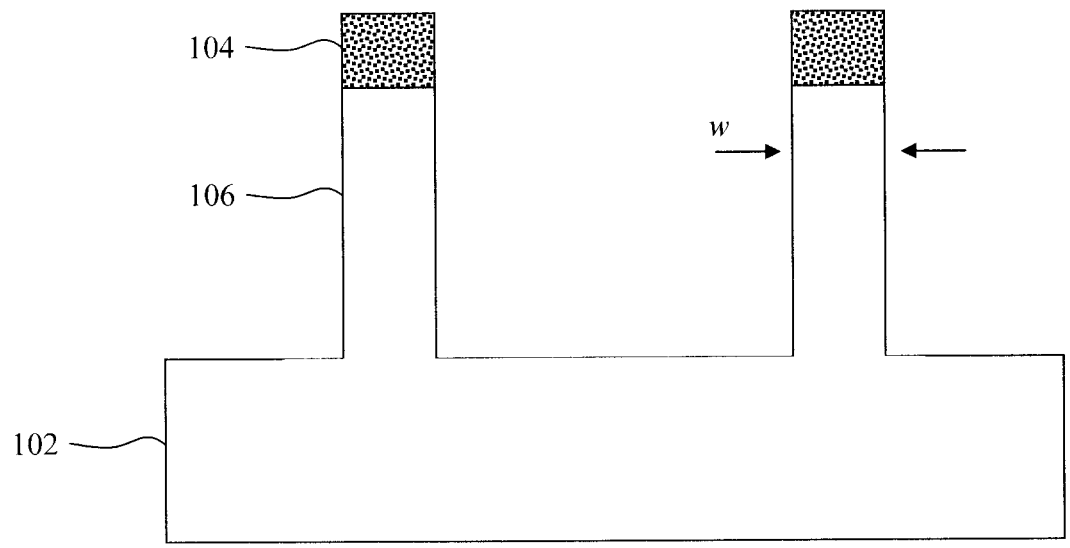
FIG. 1 is a cross-sectional diagram illustrating fin hardmasks having been used to pattern fins in a wafer according to an embodiment of the present invention.

An exemplary methodology for forming a VTFET device in accordance with the present techniques is now described by way of reference to FIGS. 1-14. As shown in FIG. 1, the process begins with at least one fin 106 being patterned in a wafer 102.

According to an exemplary embodiment, wafer 102 is a bulk semiconductor wafer, such as a bulk silicon (Si), bulk germanium (Ge), bulk silicon germanium (SiGe) and/or bulk III-V semiconductor wafer. Alternatively, wafer 102 can be a semiconductor-on-insulator (SOI) wafer. A SOI wafer includes a SOI layer separated from an underlying substrate by a buried insulator. When the buried insulator is an oxide it is referred to herein as a buried oxide or BOX. The SOI layer can include any suitable semiconductor, such as Si, Ge, SiGe, and/or a III-V semiconductor.

In order to pattern fins 106 in wafer 102, fin hardmasks 104 are first formed on the wafer 102. The fin hardmasks 194 are formed by depositing a suitable hardmask material on the wafer 102 and then using standard lithography and etching techniques to pattern the hardmask material into the individual fin hardmasks 104 shown in FIG. 1. Suitable hardmask materials include, but are not limited to, nitride hardmask materials such as silicon nitride (SiN) and/or silicon oxycarbonitride (SiOCN).

An etch using the fin hardmasks 104 is then used to pattern fins 106 in the wafer 102. A directional (i.e., anisotropic) etching process such as reactive ion etching (RIE) can be used for the fin etch. As shown in FIG. 1, the as-patterned fins 106 extend partway through the wafer 102. According to an exemplary embodiment, each of the fins 106 has a width w of from about 5 nanometers (nm) to about 30 nm and ranges therebetween.

A liner 202 is then formed alongside the fins 106 and on the exposed surfaces of the wafer 102. As highlighted above, liner 202 serves to increase the diffusivity of dopants from the bottom source and drains (to be formed below) into the fins 106 for bottom extension formation. Thus, a general requirement of the material used for liner 202 is that it has a higher diffusivity for dopants than the fin material. The term "diffusivity" as used herein refers generally to a measure of the capability of a material to let something (i.e. a dopant(s)) pass by diffusion. By way of example only, when the wafer 102/fins 106 are formed from Si, a material such as SiGe used for the liner 202 provides a higher diffusivity for dopants as compared to Si via a drive-in anneal.

According to an exemplary embodiment, the dopants in question are n-type dopants for use in forming n-channel VTFET (NFET) devices. Suitable n-type dopants include, but are not limited to, phosphorous (P), arsenic (As) and/or antimony (Sb). The reasoning behind this is that n-type dopants diffuse relatively quickly via vacancy-mediated diffusion mechanisms as opposed to p-type dopants such as boron (B). See, for example, Chroneos et al., "Diffusion of n-type dopants in germanium," Applied Physics Reviews 1, 011301 (January 2014) (20 pages), the contents of which are incorporated by reference as if fully set forth herein. Thus, material engineering (such as the inclusion of liner 202 in close proximity to fins 106) can be used to enhance the diffusivity of the n-type dopants during VTFET formation.

Figure 7:
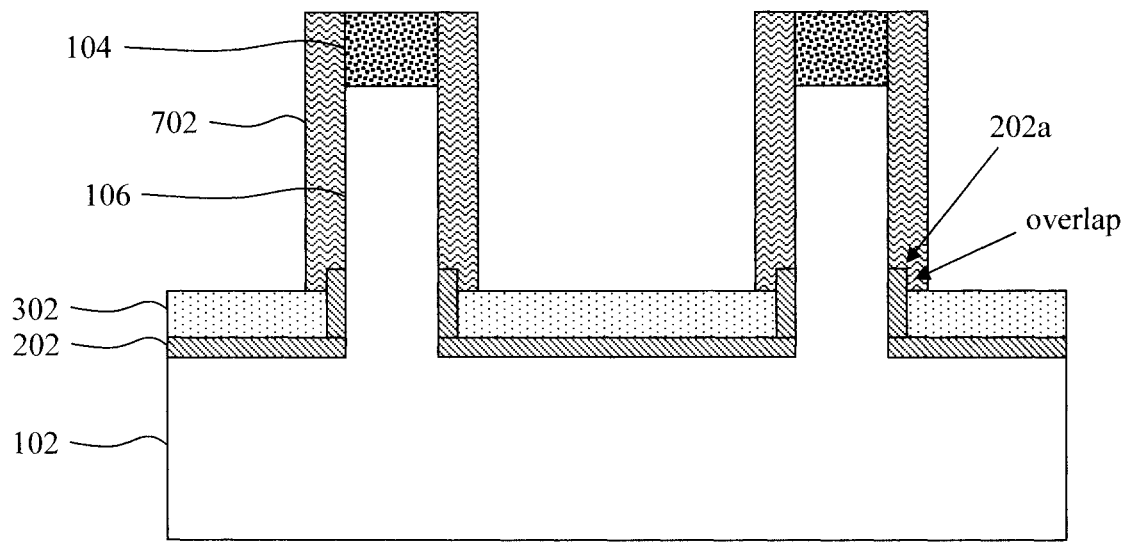
FIG. 7 is a cross-sectional diagram illustrating sidewall spacers having been formed alongside the sidewalls of the upper portions of the fins according to an embodiment of the present invention.

The diffusivity of n-type dopants such as phosphorous (P) and arsenic (As) in SiGe is described, for example, in Eguchi et al., "Comparison of arsenic and phosphorous diffusion behavior in silicon-germanium alloys," Applied Physics Letters, volume 80, number 10, pgs. 1743-1745 (March 2002) (hereinafter "Eguchi"), the contents of which are incorporated by reference as if fully set forth herein. For instance, as described in Eguchi, ion-implanted arsenic and phosphorous have been found to diffuse faster in SiGe than in Si. Further, an increased germanium (Ge) content in the SiGe can enhance the diffusivity. See, for example, Chidambaram et al., "Fundamentals of Silicon Material Properties for Successful Exploitation of Strain Engineering in Modern CMOS Manufacturing," IEEE Transactions on Electron Devices, vol. 53, no. 5, pgs. 944-964 (May 2006) (hereinafter "Chidambaram"), the contents of which are incorporated by reference as if fully set forth herein. As shown in FIG. 7 of Chidambaram, the diffusivity of n-type dopants such as arsenic (As) and antimony (Sb) increases with an increase in Ge percentage, while the diffusivity of phosphorous (P) increases with an increase in Ge percentage up to about 25%, after which the diffusivity decreases.

According to an exemplary embodiment, the fins 106 are formed from Si and the liner 202 is formed from SiGe. Further, the SiGe liner 202 has a Ge percentage of from about 5% to about 90% and ranges therebetween. e.g., from about 5% to about 20% and ranges therebetween. As provided above, the effect of Ge percentage on diffusivity in the SiGe liner 202 can depend on the particular dopant(s). For instance, for Ge percentages greater than about 25% it may be desirable to select dopants such as arsenic (As) and antimony (Sb) over phosphorous (P) for enhanced diffusivity.

Figure 2:
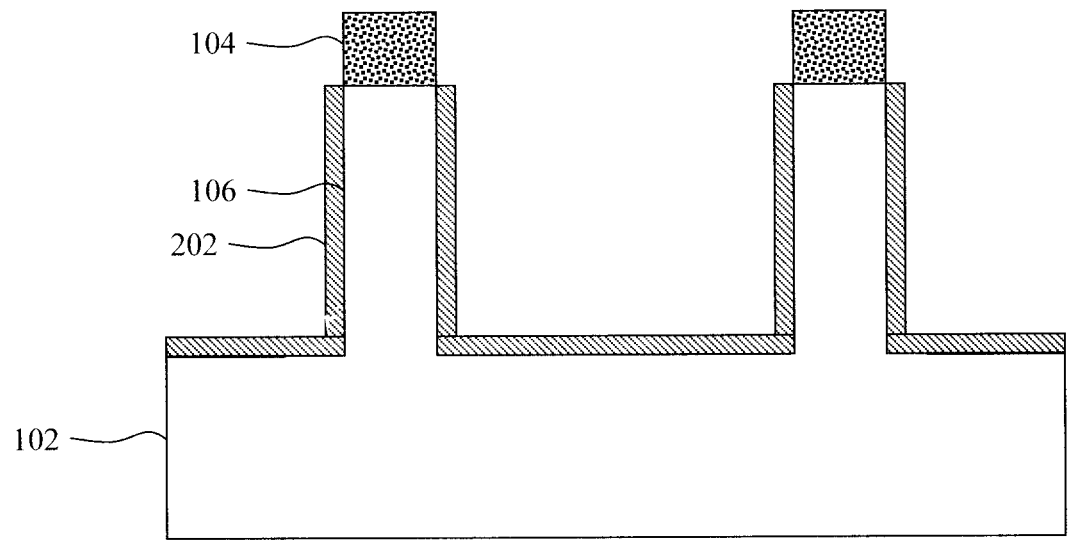
FIG. 2 is a cross-sectional diagram illustrating liner having been formed alongside the fins and on the exposed surfaces of the wafer according to an embodiment of the present invention.
Figure 3:
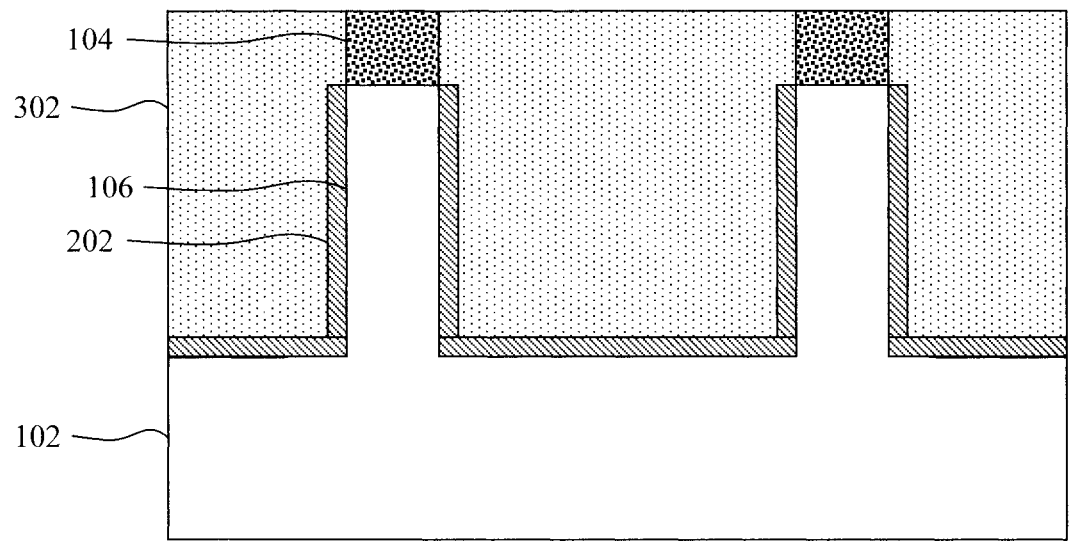
FIG. 3 is a cross-sectional diagram illustrating a sacrificial oxide having been deposited onto the liner over the wafer/fins according to an embodiment of the present invention.

According to an exemplary embodiment, the liner 202 is epitaxially grown on the wafer 102/fins 106. Epitaxial growth will occur only on the exposed surfaces of the wafer 102/fins 106 as shown in FIG. 2. By way of example only, the liner 202 is formed having a thickness of from about 2 nm to about 10 nm and ranges therebetween.

A sacrificial oxide 302 is then deposited onto the liner 202 over the wafer 102/fins 106. By 'sacrificial' it is meant that oxide 302 will later be removed and replaced with the bottom source and drains. As will become apparent from the description that follows, sacrificial oxide 302 enables recessing of the liner 202 and placement of spacers alongside the fins 106. Suitable materials for the sacrificial oxide 302 include, but are not limited to, silicon dioxide ($SiO_2$) and/or silicon oxycarbide (SiOC). Suitable processes for depositing sacrificial oxide 302 include, but are not limited to, chemical vapor deposition (CVD), atomic layer deposition (ALD) and physical vapor deposition (PVD), high density plasma (HDP) deposition, and flowable oxide deposition process. The sacrificial oxide 302 can be planarized using a suitable process such as, for example, chemical mechanical polishing (CMP).

Figure 4:
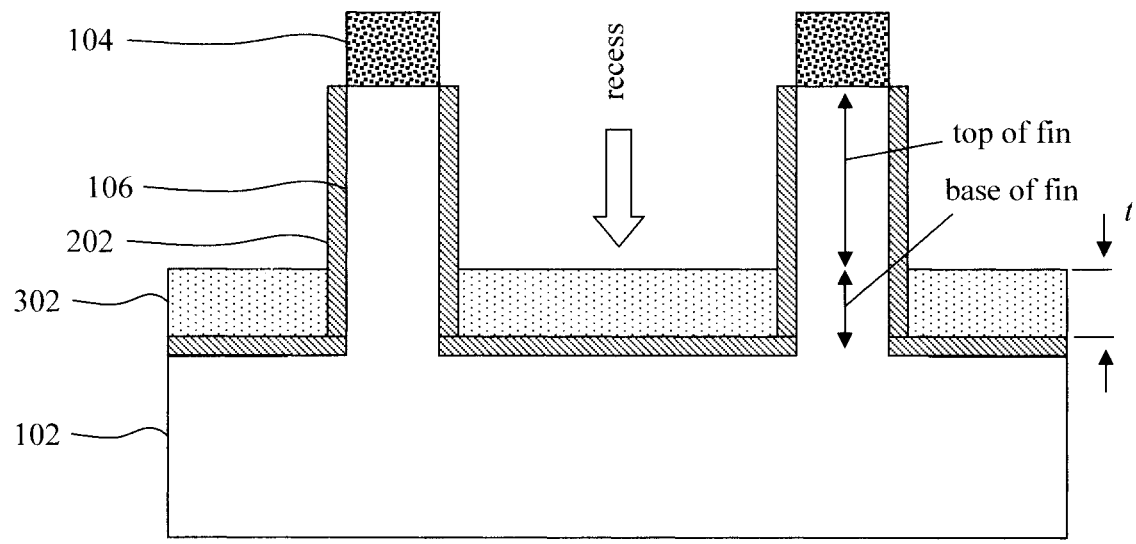
FIG. 4 is a cross-sectional diagram illustrating the sacrificial oxide having been recessed to expose a portion of the liner alongside a top portion of the fins according to an embodiment of the present invention.

As shown in FIG. 4, the sacrificial oxide 302 is then recessed to expose a portion of the liner 202 alongside a top portion of the fins 106. According to an exemplary embodiment, the recessed sacrificial oxide 302 has a thickness t of from about 20 nm to about 50 nm and ranges therebetween. An oxide-selective etch can be employed for the recess of sacrificial oxide 302 selective to the (e.g., SiGe) liner 202. As shown in FIG. 4, following the recess of sacrificial oxide 302, a portion of the liner 202 alongside a top portion of the fins 106 will be exposed, and a portion of the liner 202 alongside a base of the fins 106 and on the wafer 102 remain covered by the sacrificial oxide 302.

The exposed portion of the liner 202 alongside the top portion of the fins 106 is then removed, thereby recessing the liner 202. See FIG. 5. A non-directional (i.e., isotropic) etching process such as a wet etching chemistry can be used to recess the liner 202. The top portions of the fins 106 are now exposed.

Figure 5:
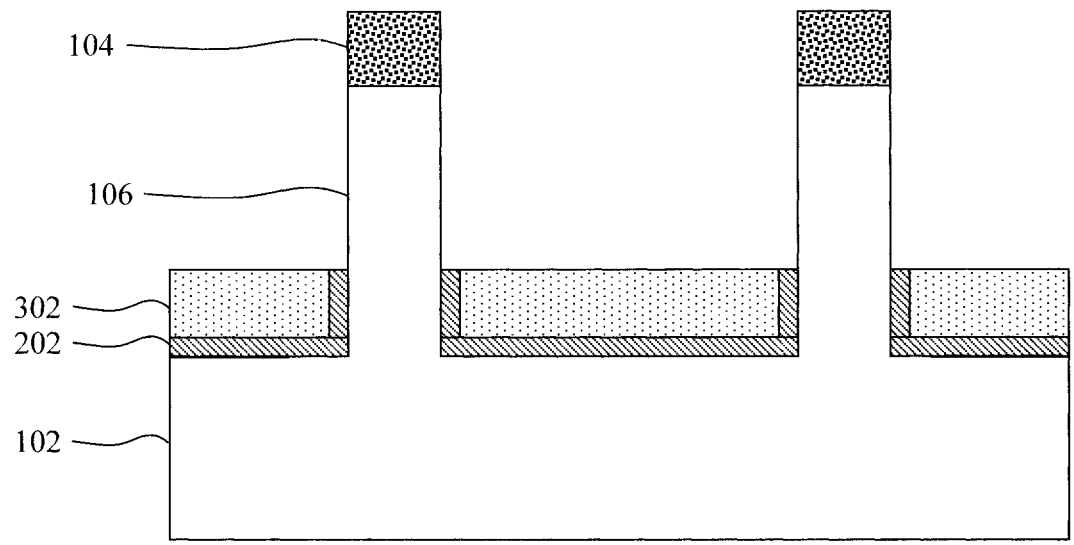
FIG. 5 is a cross-sectional diagram illustrating the exposed portion of the liner alongside the top portion of the fins having been removed, thereby recessing the liner according to an embodiment of the present invention.
Figure 6:
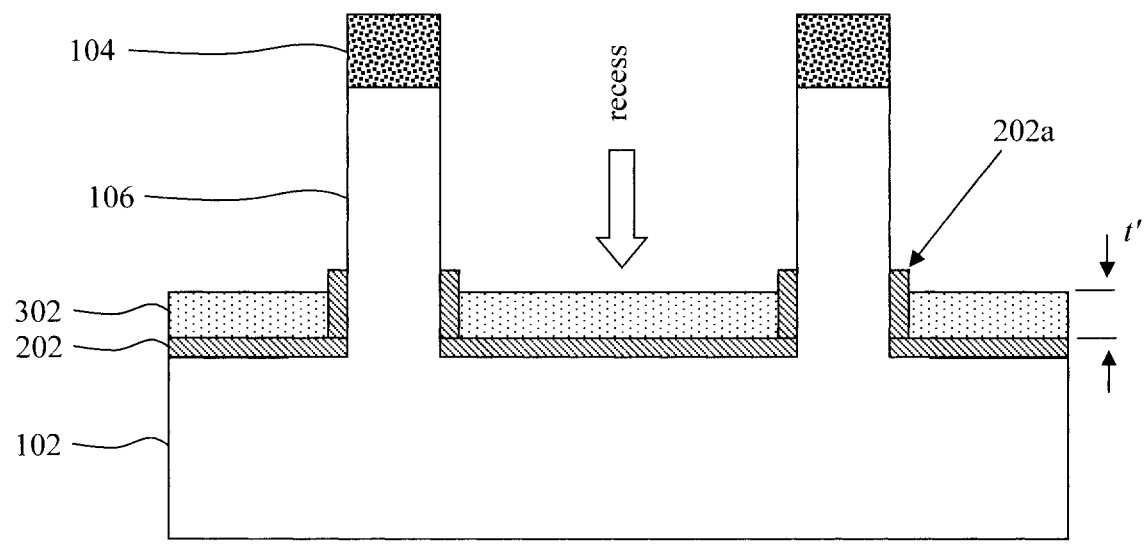
FIG. 6 is a cross-sectional diagram illustrating a second recess of the sacrificial oxide having been performed to expose a portion of the liner that sticks out above the further recessed sacrificial oxide according to an embodiment of the present invention.

The recessed sacrificial oxide 302 sets the height of the recessed liner 202. Namely, as shown in FIG. 5, the recessed liner 202 is now substantially coplanar with the recessed sacrificial oxide 302. However, it is desirable to have the liner 202 stick out from the top of the sacrificial oxide 302. That way, when sidewall spacers are formed alongside the fins 106 (see below), the sidewall spacers will overlap a portion of the liner 202. As will become apparent from the description that follows, the sidewall spacers will be used during the recess of the wafer 102 needed to form the bottom source and drains below the sidewall spacers. The portion of the liner 202 overlapped by the spacers will permit the bottom extensions to extend from the bottom source and drains to the gate (see below).

Thus, a second recess of the sacrificial oxide 302 is performed to expose a portion 202a of the liner 202 that sticks out above the further recessed sacrificial oxide 302. See FIG. 6. According to an exemplary embodiment, the further recessed sacrificial oxide 302 has a thickness t' of from about 10 nm to about 40 nm and ranges therebetween. As above, an oxide-selective etch can be employed for the recess of sacrificial oxide 302 selective to the (e.g., SiGe) liner 202.

Sidewall spacers 702 are then formed alongside the (exposed) sidewalls of the upper portions of the fins 106. See FIG. 7. According to an exemplary embodiment, the sidewall spacers 702 are formed by blanket depositing a suitable spacer material over the fins 106/liner 202 using a process such as CVD or ALD, and then etching back the spacer material to form the individual sidewall spacers 702 shown in FIG. 7 alongside the sidewalls of the fins 106. Suitable spacer materials include, but are not limited to, SiN, silicon boron carbide nitride (SiBCN) and/or SiOCN. A directional (i.e., anisotropic) etching process such as RIE can be used for the spacer etch back. Fin hardmasks 104 protect the fins 106 during this spacer etch back. By way of example only, the sidewall spacers 702 are formed having a thickness of from about 5 nm to about 20 nm and ranges therebetween.

As shown in FIG. 7, the sidewall spacers 702 partially overlap the portion 202a of the liner 202 that sticks out above the recessed sacrificial oxide 302. As provided above, this overlapping configuration will enable the bottom extensions (formed by diffusion through the liner 202) to extend from the bottom source and drains up to the gate (see below).

Figure 8:
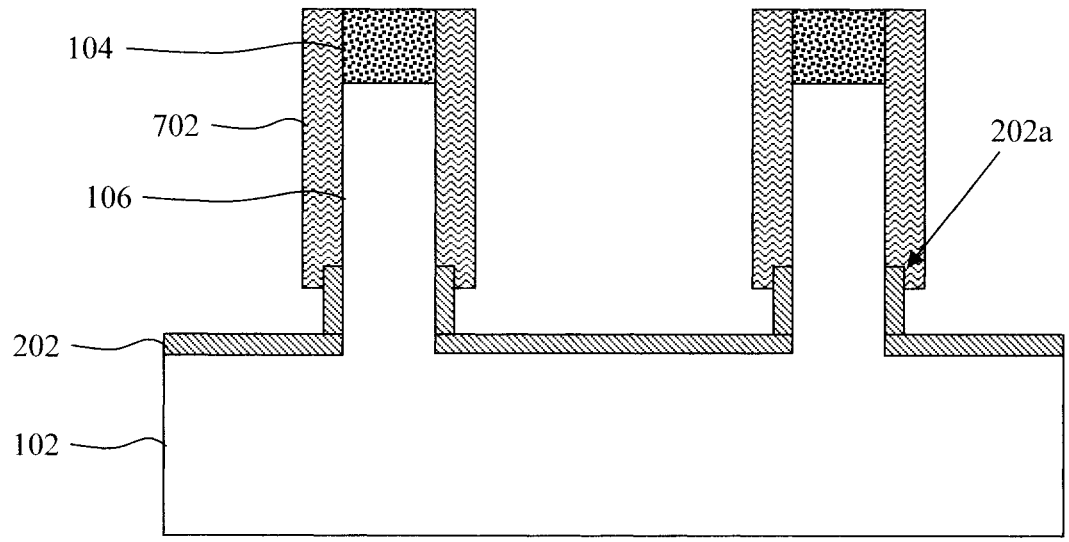
FIG. 8 is a cross-sectional diagram illustrating the remaining sacrificial oxide having been removed according to an embodiment of the present invention.

The remaining sacrificial oxide 302 is then removed. See FIG. 8. An oxide-selective non-directional (i.e., isotropic) etching process can be employed to clear the sacrificial oxide 302. As shown in FIG. 8, the liner 202 is now exposed below the sidewall spacers 702. It is notable that, with a conventional VTFET process flow, an additional recess of the wafer/substrate is often performed to provide space at the base of the fins for the bottom source and drain. With the present techniques however, the sacrificial oxide 302 is used to place the spacers up from the base of the fins 106. Thus, following removal of the sacrificial oxide 302 there is already space at the base of the fins 106 for the bottom source and drains, and no further recess of the wafer 102 is performed.

Figure 9:
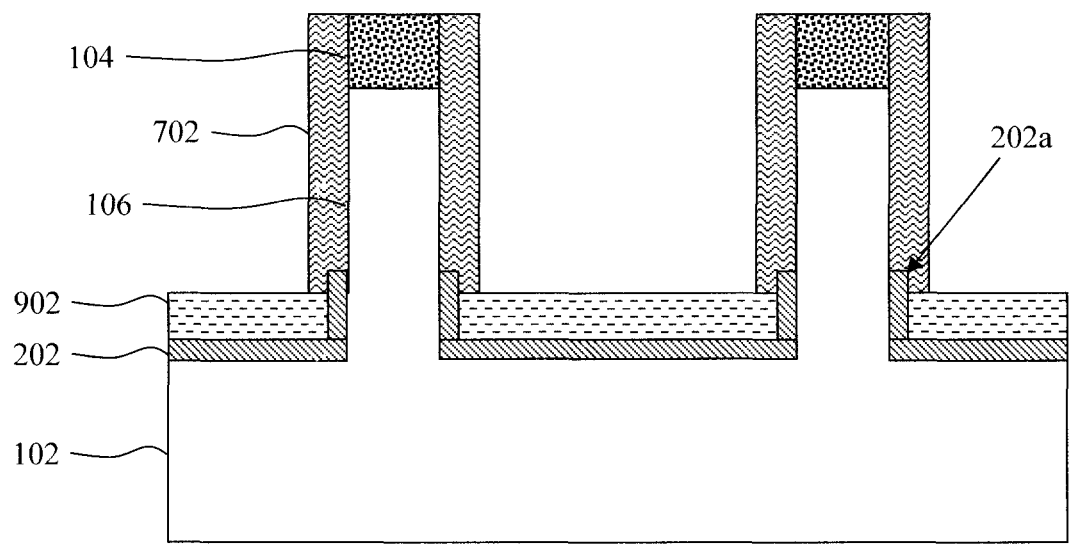
FIG. 9 is a cross-sectional diagram illustrating doped bottom source and drains having been formed at the base of the fins below the sidewall spacers according to an embodiment of the present invention.

Namely, as shown in FIG. 9, doped bottom source and drains 902 are formed at the base of the fins 106 below the sidewall spacers 702. According to an exemplary embodiment, the bottom source and drains 902 are formed using epitaxial growth whereby an n-type dopant(s) is introduced during growth (i.e., in-situ) or via ion implantation (i.e., ex-situ). As provided above, suitable n-type dopants include, but are not limited to, phosphorous (P), arsenic (As) and/or antimony (Sb). For instance, by way of example only, bottom source and drains 902 can be formed from phosphorous-doped Si (Si:P).

As shown in FIG. 9, epitaxial growth of bottom source and drains 902 is selective to the exposed surfaces of the (e.g., SiGe) liner 202 below the sidewall spacers 702. Namely, the fins 106 are covered by the fin hardmasks 104 and sidewall spacers 702 preventing any growth from originating on the fin surface. Growth of the bottom source and drains 902 will occur up to, and abutting, the sidewall spacers 702. According to an exemplary embodiment, the bottom source and drains 902 are formed having a thickness of from about 10 nm to about 40 nm and ranges therebetween.

A dopant drive-in anneal of the wafer 102 is then performed to form bottom extensions 1002. See FIG. 10. Namely, the dopant drive-in anneal will diffuse dopants from the bottom source and drains 902, through the liner 202, into the base of the fins 106. As provided above, the liner 202 has a higher diffusivity than the fins 106. For example, as provided in Eguchi, the ratio of the effective diffusivity in $Si_{0.8}Ge_{0.2}$ compared to that in Si is roughly seven for arsenic, and roughly two for phosphorous. As a result, the abrupt dopant profile at extension region shown in FIG. 10 will be formed. By 'abrupt' it is meant that the dopant profile at the junction between the bottom extensions 1002 and the fins 106 is very narrow. For instance, the abruptness of the dopant is below about 5 nm/decade.

This feature of an abrupt dopant profile is due to the differences in diffusivity between the liner 202 and the fins 106 and a lower annealing temperature. Specifically, with a higher diffusivity, the liner 202 permits dopants to readily diffuse from the bottom source and drains 902 to the fins 106 at a lower given temperature. According to an exemplary embodiment, the dopant drive-in anneal is performed at a temperature of from about 800° C. to about 1000° C. and ranges therebetween, for example, from about 800° C. to about 950° C. and ranges therebetween. However, once at the fins 106, diffusion of the dopants slows due to the lower diffusivity of the fins 106 and the annealing temperature (which is lower than conventional processes for dopant drive-in—see above). As such, the dopants remain localized at the base of the fins 106.

Figure 10:
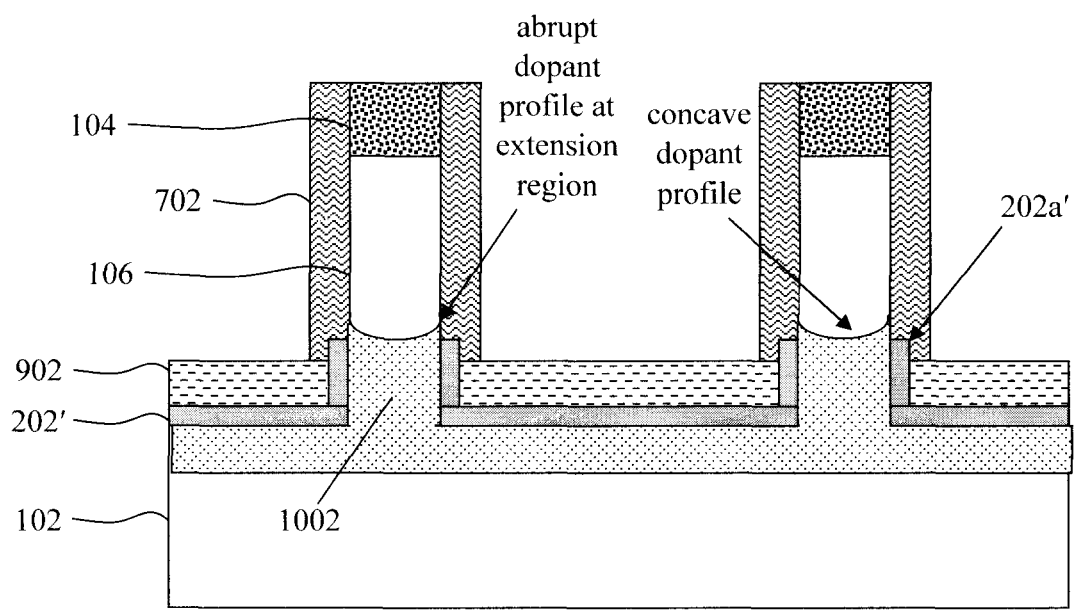
FIG. 10 is a cross-sectional diagram illustrating a dopant drive-in anneal of the wafer having been performed to form bottom extensions according to an embodiment of the present invention.
Figure 11:
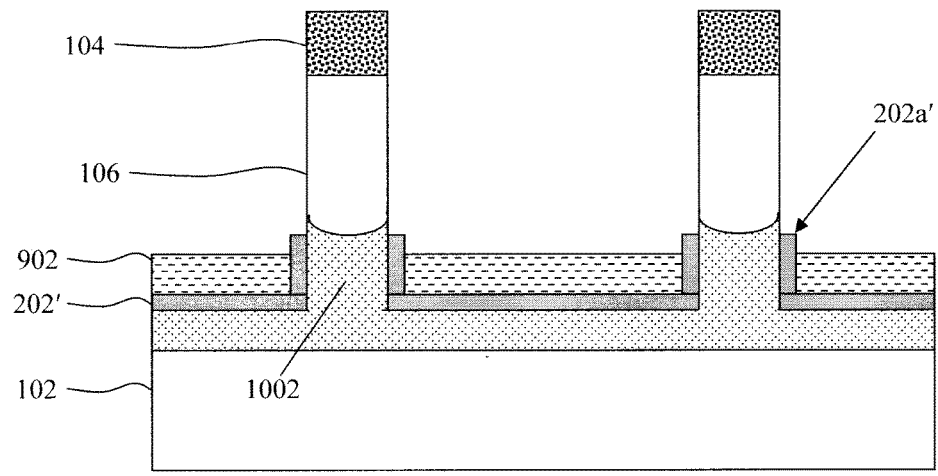
FIG. 11 is a cross-sectional diagram illustrating the sidewall spacers having been removed according to an embodiment of the present invention.

Further, due to the presence of the liner 202 alongside the base of the fins 106, the resulting extensions will have a unique concave profile that curves inward at the center of the fins 106. Specifically, as shown in FIG. 10, the dopants will readily diffuse throughout the liner 202. Accordingly, the liner is given different reference numerals (202'/202a') and different shading post drive-in anneal. The dopants will then be introduced, via the liner 202', from opposite sides of the fins 106. Thus, dopant diffusion into the fins 106 will be greatest at the sides and taper off toward the middle of the fins 106, creating the concave dopant profile shown in FIG. 10.

Following formation of the bottom extensions 1002, the sidewall spacers 702 are removed. See FIG. 11. As provided above, the sidewall spacers 702 can be formed from a nitride spacer material such as SiN, SiBCN and/or SiOCN. In that case, a nitride-selective etch can be employed to clear the sidewall spacers 702. Following removal of the sidewall spacers 702, the fins 106 are exposed which will enable completion of the VTFET device including formation of bottom spacers on the bottom source and drains 902, gate stacks alongside the fins 106, top spacers on the gate stacks and top source and drains at the tops of the fins 106.

Figure 12:
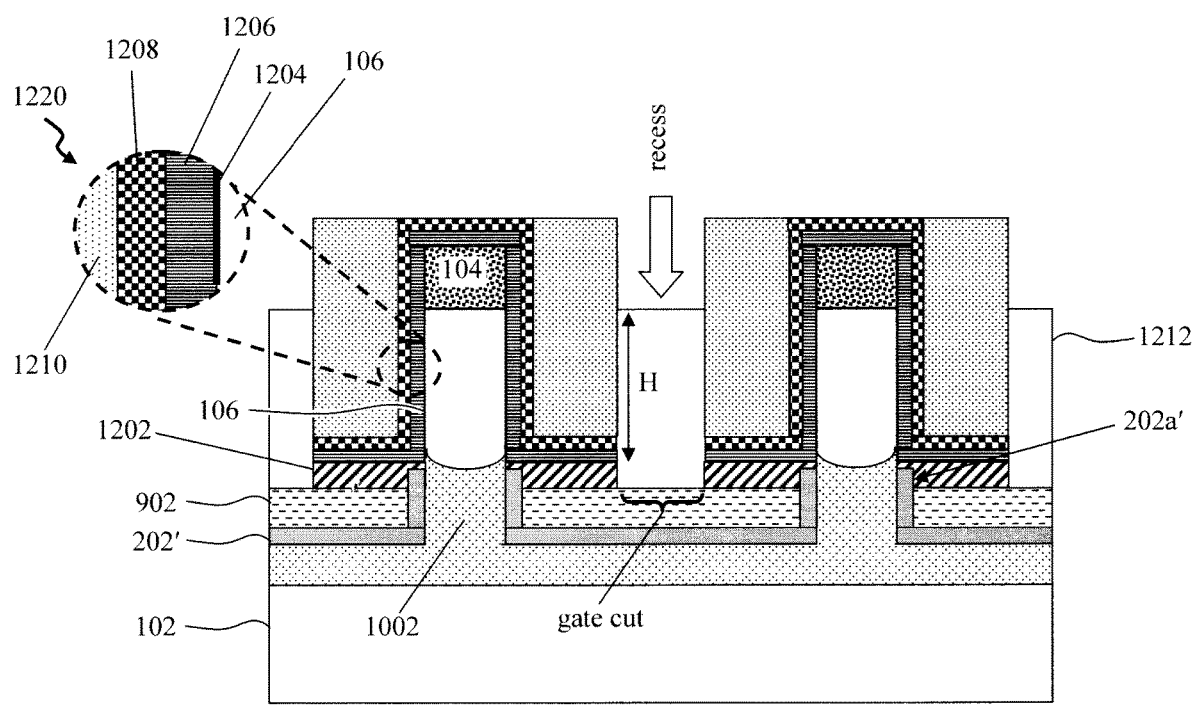
FIG. 12 is a cross-sectional diagram illustrating bottom spacers having been formed on the bottom source and drains, gate stacks having been formed alongside the fins above the bottom spacers, and the gate stacks having been buried in a dielectric which is then recessed according to an embodiment of the present invention.
Figure 13:
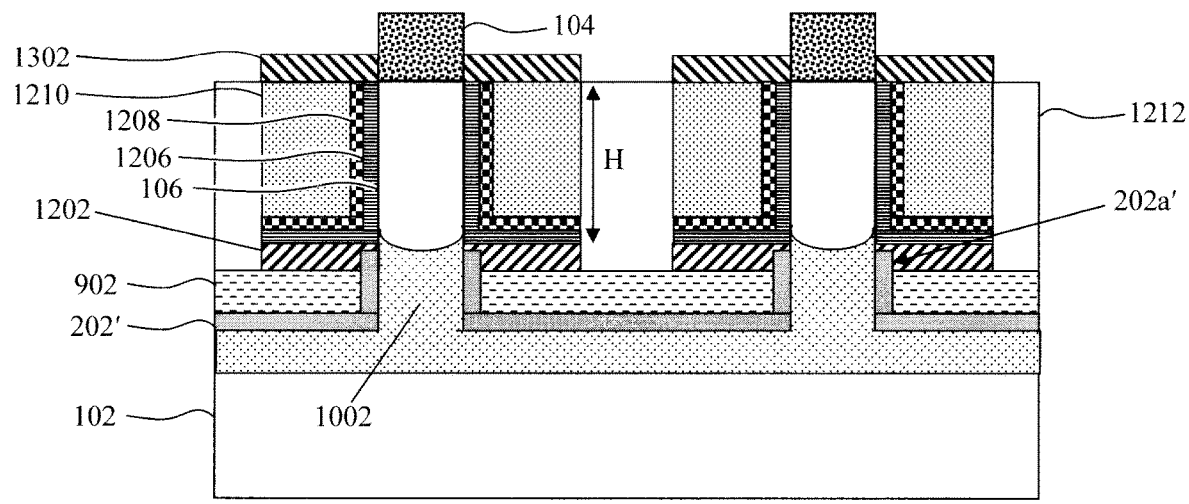
FIG. 13 is a cross-sectional diagram illustrating the gate stacks having been recessed to the level of the recessed dielectric, and top spacers having been formed above the gate stacks according to an embodiment of the present invention.
Figure 14:
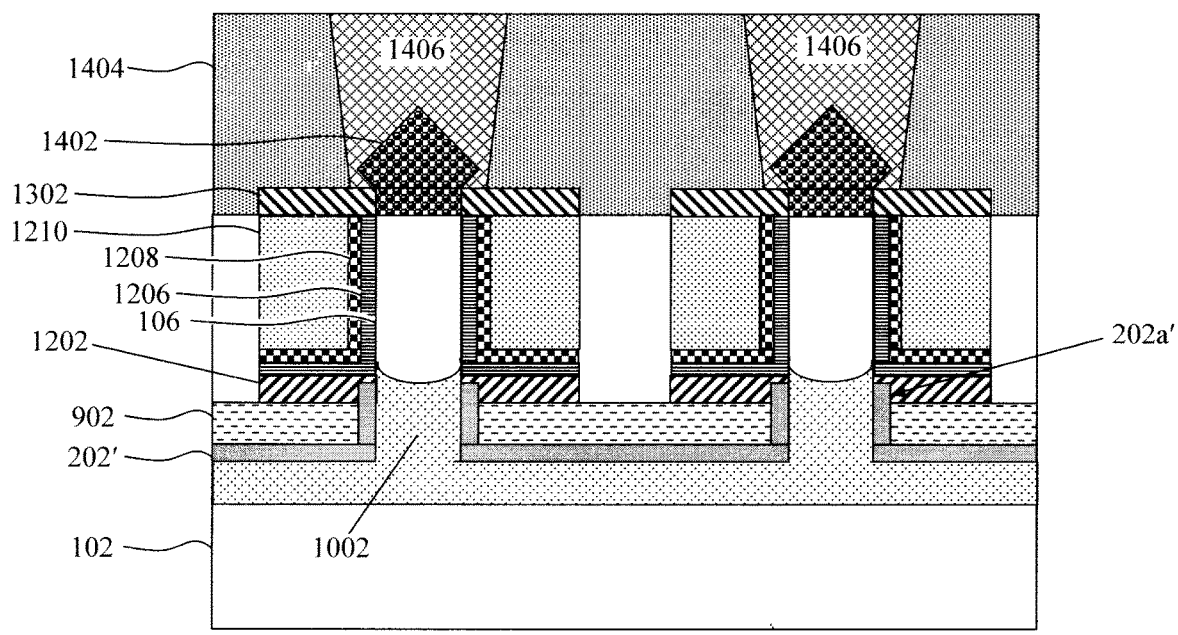
FIG. 14 is a cross-sectional diagram illustrating the fins hardmasks having been removed, top source and drains having been formed above the top spacers at the tops of the fins, and contacts to the top source and drains having been formed according to an embodiment of the present invention.

Namely, as shown in FIG. 12, bottom spacers 1202 are formed on the bottom source and drains 902. Suitable materials for the bottom spacers 1202 include, but are not limited to, oxide spacer materials such as $SiO_2$ and/or SiOC and/or nitride spacer materials such as SiN. SiBCN, SiOCN and/or silicon-boron-nitride (SiBN).

According to an exemplary embodiment, the bottom spacers 1202 are formed using a directional deposition process whereby the spacer material is deposited onto the bottom source and drains 902, fin hardmasks 104 and fins 106 with a greater amount of the material being deposited on horizontal surfaces (including on top of the bottom source and drains 902), as compared to vertical surfaces (such as along sidewalls of the fins 106). Thus, when an etch is used on the spacer material, the timing of the etch needed to remove the spacer material from the vertical surfaces will leave the bottom spacers 1202 shown in FIG. 12 on the bottom source and drain 902 since a greater amount of the spacer material was deposited on the bottom source and drains 902. By way of example only, a high-density plasma (HDP) chemical vapor deposition (CVD) or physical vapor deposition (PVD) process can be used for directional film deposition, and an oxide- or nitride-selective (depending on the spacer material) isotropic etch can be used to remove the (thinner) spacer material deposited onto the vertical surfaces.

Gate stacks are then formed alongside the fins 106 above the bottom spacers 1202. As shown in magnified view 1220, the gate stacks include an interfacial oxide 1204 on exposed surfaces of the fins 106, a gate dielectric 1206 disposed over the interfacial oxide 1204, and a gate conductor 1210 disposed on the gate dielectric 1206. In the present example, an (optional) workfunction setting layer 1208 is present between the gate dielectric 1206 and gate conductor 1210.

According to an exemplary embodiment, the interfacial oxide 1204 is formed on the exposed surfaces of the fins 106 by an oxidation process to a thickness of from about 0.3 nm to about 5 nm and ranges therebetween. e.g., about 1 nm. The gate dielectric 1206 is deposited over the interfacial oxide 1204 and onto the bottom spacers 1202 using a process such as thermal oxidation, chemical oxidation, thermal nitridation, plasma oxidation, plasma nitridation, ALD, CVD, etc. The (optional) workfunction setting layer 1208 and gate conductor 1210 are deposited onto the gate dielectric 1206 using a process such as ALD, CVD, PVD, sputtering, plating, evaporation, ion beam deposition, electron beam deposition, laser assisted deposition, chemical solution deposition, etc.

Suitable gate conductors include, but are not limited to, doped polycrystalline or amorphous silicon (Si), germanium (Ge), silicon germanium (SiGe), a metal (e.g., tungsten (W), titanium (Ti), tantalum (Ta), ruthenium (Ru), hafnium (Hf), zirconium (Zr), cobalt (Co), nickel (Ni), copper (Cu), aluminum (Al), platinum (Pt), tin (Sn), silver (Ag), gold (Au), a conducting metallic compound material (e.g., tantalum nitride (TaN), titanium nitride (TiN), tantalum carbide (TaC), titanium carbide (TiC), titanium aluminum carbide (TiAlC), tungsten silicide (WSi), tungsten nitride (WN), ruthenium oxide ($RuO_2$), cobalt silicide (CoSi), nickel silicide (NiSi)), transition metal aluminides (e.g. $Ti_3Al$, ZrAl), TaC, TaMgC, carbon nanotubes, conductive carbon, graphene, or any combinations thereof. The gate conductor can further include dopants that are incorporated during or after deposition. As provided above, an optional workfunction setting layer 1208 can be employed between the gate dielectric 1206 and gate conductor 1210. The workfunction setting layer can be a workfunction metal. The workfunction metal can be any suitable material including, but not limited to, a nitride, including but not limited to titanium nitride (TiN), titanium aluminum nitride (TiAlN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a carbide, including but not limited to titanium carbide (TiC) titanium aluminum carbide (TiAlC), tantalum carbide (TaC), hafnium carbide (HfC), and combinations thereof. In some embodiments, a conductive material or a combination of multiple conductive materials can serve as both gate conductor and workfunction metal.

Suitable gate dielectrics include, but are not limited to, silicon oxide (SiOx), silicon nitride (SiN), silicon oxynitride (SiOxNy), high-K materials, or any combination thereof. The term "high-K" as used herein refers to a material having a relative dielectric constant K which is much higher than that of silicon dioxide (e.g., a dielectric constant K is about 25 for hafnium oxide ($HfO_2$) rather than 3.9 for $SiO_2$). Suitable high-r materials include, but are not limited to, metal oxides such as hafnium oxide ($HfO_2$), hafnium silicon oxide (HfSiO), hafnium silicon oxynitride (HfSiO), lanthanum oxide ($La_2O_3$), lanthanum aluminum oxide ($LaAlO_3$), zirconium oxide ($ZrO_2$), zirconium silicon oxide ($ZrSiO_4$), zirconium silicon oxynitride (ZrSiOxNy), tantalum oxide (TaOx), titanium oxide (TiO), barium strontium titanium oxide ($BaO_6SrTi_2$), barium titanium oxide ($BaTiO_3$), strontium titanium oxide ($SrTiO_3$), yttrium oxide ($Y_2O_3$), aluminum oxide ($Al_2O_3$), lead scandium tantalum oxide (Pb(Sc,Ta)$O_3$), and/or lead zinc niobite (Pb(Zn,Nb)O). The high-K dielectric can further include dopants such as lanthanum (La), aluminum (Al) and/or magnesium (Mg). According to an exemplary embodiment, the gate dielectric 1206 has a thickness of from about 1 nm to about 5 nm and ranges therebetween, although less thicknesses and greater thicknesses are also conceived.

The gate stacks are deposited uniformly over the fins 106. In order to isolate individual VTFET devices, a gate cut is performed to separate the gate stacks of adjacent devices. See FIG. 12.

The next task is to recess the gate stacks to a desired height H. To do so, the gate stacks are first buried in a dielectric 1212. Suitable dielectrics include, but are not limited to, $SiO_2$ and/or SiOC. Following deposition, the dielectric 1212 is then recessed to the height H. See FIG. 12. According to an exemplary embodiment, H is from about 10 nm to about 50 nm and ranges therebetween. Any suitable etching process or combination of processes can be employed to recess the dielectric 1212. By way of example, a combination of chemical-mechanical polishing (CMP) followed by an oxide-selective wet chemical etch can be used to recess the dielectric 1212.

The gate stacks are then recessed to the level of the (recessed) dielectric 1212. See FIG. 13. Any suitable etching process or combination of processes can be employed to recess the gate stacks. By way of example, a combination of CMP followed by a RIE step(s) and a wet chemical etch can be used to recess the gate stacks.

Top spacers 1302 are then formed above the gate stacks. See FIG. 13. Suitable materials for the top spacers 1302 include, but are not limited to, oxide spacer materials such as $SiO_2$ and/or SiOC and/or nitride spacer materials such as SiN, SiBCN, SiOCN and/or SiBN. As with the bottom spacers 1202, the top spacers 1302 can be formed using a directional deposition process. See above.

The fins hardmasks 104 are then removed, and top source and drains 1402 are formed above the top spacers 1302 at the tops of the fins 106. See FIG. 14. According to an exemplary embodiment, the top source and drains 1402 are formed using epitaxial growth whereby an n-type dopant(s) is introduced during growth (i.e., in-situ) or via ion implantation (i.e., ex-situ). As provided above, suitable n-type dopants include, but are not limited to, phosphorous (P), arsenic (As) and/or antimony (Sb). For instance, by way of example only, top source and drains 1402 can be formed from phosphorous-doped Si (Si:P).

Further processing steps can then be performed to complete the device. For instance, according to an exemplary embodiment, an interlayer dielectric (ILD) 1404 is deposited over the VTFET devices. See FIG. 14. Suitable ILD materials include, but are not limited to, $SiO_2$. Contacts 1406 to the top source and drains 1402 are then formed in the ILD 1404. To do so, standard lithography and etching techniques are used to pattern contact trenches in the ILD 1404. The contact trenches are then filled with a contact metal(s) to form the contacts 1406 shown in FIG. 14. Suitable contact metals include, but are not limited to, copper (Cu), nickel (Ni), titanium (Ti), tungsten (W) and/or platinum (Pt).

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method of forming a vertical transport field effect transistor (VTFET) device, comprising the steps of:
    patterning fins in a wafer;
    forming a liner at a base of the fins, wherein the liner has a higher diffusivity for dopants than the fins;
    forming sidewall spacers alongside an upper portion of the fins, wherein the sidewall spacers partially overlap the liner;
    forming bottom source and drains on the liner at the base of the fins below the sidewall spacers, wherein the bottom source and drains comprise the dopants;
    annealing the wafer to diffuse the dopants from the bottom source and drains, through the liner, into the base of the fins to form bottom extensions;
    removing the sidewall spacers;
    forming bottom spacers on the bottom source and drains;
    forming gate stacks alongside the fins above the bottom spacers;
    forming top spacers above the gate stacks; and
    forming top source and drains above the top spacers at tops of the fins.

2. The method of claim 1, wherein the fins comprise silicon (Si).

3. The method of claim 2, wherein the liner comprises silicon germanium (SiGe).

4. The method of claim 3, wherein the SiGe has a germanium (Ge) concentration of from about 5% to about 90% and ranges therebetween.

5. The method of claim 3, wherein the SiGe has a Ge concentration of from about 5% to about 20% and ranges therebetween.

6. The method of claim 1, wherein the dopants comprise n-type dopants selected from the group consisting of: phosphorous (P), arsenic (As), antimony (Sb) and combinations thereof.

7. The method of claim 1, further comprising the steps of:
    depositing the liner on exposed surfaces of the fins and the wafer;
    depositing a sacrificial oxide over the liner;
    recessing the sacrificial oxide to expose a portion of the liner alongside a top portion of the fins; and
    removing the portion of the liner alongside a top portion of the fins, leaving the liner at the base of the fins.

8. The method of claim 7, further comprising the steps of:
    further recessing the sacrificial oxide such that the liner sticks out above the sacrificial oxide; and
    forming the sidewall spacers alongside the upper portion of the fins that overlap the liner that sticks out above the sacrificial oxide.

9. The method of claim 7, further comprising the step of:
    epitaxially growing the liner on the exposed surfaces of the fins and the wafer.

10. The method of claim 1, wherein the sidewall spacers are formed from a material selected from the group consisting of: silicon nitride (SiN), silicon boron carbide nitride (SiBCN), silicon oxycarbonitride (SiOCN), and combinations thereof.

11. The method of claim 1, wherein the annealing is performed at a temperature of from about 800° C. to about 1000° C. and ranges therebetween.

12. The method of claim 1, wherein the annealing is performed at a temperature of from about 800° C. to about 950° C. and ranges therebetween.

13. The method of claim 1, wherein the bottom extensions have a concave dopant profile that curves inward at a center of the fins.

14. The method of claim 1, wherein the bottom spacers and the top spacers each comprise a material selected from the group consisting of: silicon dioxide ($SiO_2$), silicon oxycarbide (SiOC), SiN, silicon-boron-nitride (SiBN), SiBCN and combinations thereof.

15. The method of claim 1, wherein the gate stacks comprise:
    an interfacial oxide on exposed surfaces of the fins;
    a gate dielectric disposed over the interfacial oxide; and
    a gate conductor disposed on the gate dielectric.

16. The method of claim 15, wherein the gate stacks further comprise:
    a workfunction setting layer between the gate dielectric and the gate conductor.

* * * * *